United States Patent
Zhang (10) Patent No.: US 7,572,130 B1
(45) Date of Patent: Aug. 11, 2009

(54) ELECTRICAL CONNECTOR ASSEMBLY

(75) Inventor: George(Huanyi) Zhang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/080,327

(22) Filed: Apr. 1, 2008

(51) Int. Cl.
*H01R 12/00* (2006.01)

(52) U.S. Cl. .................................................. 439/79

(58) Field of Classification Search .............. 439/79, 439/571
See application file for complete search history.

(56) References Cited

U.S. PATENT DOCUMENTS

| | | | | |
|---|---|---|---|---|
| 5,238,413 | A * | 8/1993 | McCaffrey et al. | 439/79 |
| 5,622,519 | A * | 4/1997 | Bixler et al. | 439/570 |
| 5,641,308 | A * | 6/1997 | Bixler et al. | 439/660 |
| 5,658,154 | A * | 8/1997 | Bumsted et al. | 439/79 |
| 5,823,799 | A * | 10/1998 | Tor et al. | 439/79 |
| 5,876,222 | A * | 3/1999 | Gardner et al. | 439/79 |
| 5,897,386 | A * | 4/1999 | Baxter et al. | 439/79 |
| 5,980,273 | A * | 11/1999 | Yong et al. | 439/79 |
| 5,993,263 | A * | 11/1999 | Sampson | 439/660 |
| 6,162,091 | A * | 12/2000 | Kurotori et al. | 439/567 |
| 6,217,347 | B1 * | 4/2001 | Schell et al. | 439/79 |
| 6,293,818 | B1 * | 9/2001 | Kim et al. | 439/495 |
| 6,712,632 | B2 * | 3/2004 | Wu | 439/328 |
| 6,733,335 | B2 * | 5/2004 | Wu | 439/570 |
| 6,736,651 | B2 * | 5/2004 | Ho | 439/79 |
| 6,746,281 | B1 * | 6/2004 | Zhang | 439/637 |
| 6,764,344 | B2 * | 7/2004 | Maiers | 439/629 |
| 6,767,235 | B2 * | 7/2004 | Wu | 439/328 |
| 6,790,053 | B2 * | 9/2004 | Lin et al. | 439/79 |
| 6,832,934 | B1 * | 12/2004 | Zhang | 439/660 |
| 7,331,818 | B2 * | 2/2008 | Wu et al. | 439/573 |
| 7,497,709 | B1 * | 3/2009 | Zhang | 439/188 |
| 2001/0021597 | A1 * | 9/2001 | Lin et al. | 439/79 |
| 2003/0003809 | A1 * | 1/2003 | Maiers | 439/629 |
| 2003/0139093 | A1 * | 7/2003 | Zhang | 439/571 |
| 2003/0224646 | A1 * | 12/2003 | Wu | 439/328 |
| 2004/0259395 | A1 * | 12/2004 | Yang et al. | 439/79 |
| 2005/0233602 | A1 * | 10/2005 | Link | 439/59 |
| 2006/0052006 | A1 * | 3/2006 | Amano et al. | 439/638 |
| 2007/0293085 | A1 * | 12/2007 | Marcade et al. | 439/567 |
| 2008/0176426 | A1 * | 7/2008 | Zhu et al. | 439/79 |
| 2009/0068896 | A1 * | 3/2009 | Zhang | 439/626 |

FOREIGN PATENT DOCUMENTS

TW          M313341          6/2007

* cited by examiner

*Primary Examiner*—Ross N Gushi
(74) *Attorney, Agent, or Firm*—Wei Te Chung (57) ABSTRACT

A connector includes a connector body having a front connector mating interface (301), an upper surface (303), a bottom surface (305), and a back mounting surface (306) locatable between the upper surface and the bottom surface. A pair of solder components (31) is located at opposite sides of the body, each extending from adjacent one of the upper and bottom surfaces towards the other in a first direction, and then reversely in an opposite second direction towards the mounting surface. The configuration of the solder components will take full advantage of the width of the side section of the connector body along a vertical direction so as to enable the solder components to have a strong connection between the connector and the circuit board.

15 Claims, 10 Drawing Sheets

ELECTRICAL CONNECTOR ASSEMBLY

BACKGROUND OF THE INVENTION

1. Field of the Invention

The present invention relates to an electrical connection device, and particularly to an electrical connector assembly including a printed circuit board adapted to have same or different connectors respectively mounted on opposed surface thereof.

2. Description of the Related Art

In the recent years, all kinds of connectors with different mating interfaces have been emerging in order to meet different demands of end users. Meanwhile, the end users also require a common printed circuit board to be equipped with connectors having different mating interfaces adapted to mate with different electronic components, such as the existing and emerging ones, so as to take the full advantage of the real estate of the printed circuit board. This arrangement will avoid one printed circuit board having thereon a connector with a first mating interface to be replaced with another printed circuit board having another connector with a second mating interface, different from the first mating interface, adapted to mate with another different electronic component. So one printed circuit board is supposed to have connectors, with thereof different mating interfaces, to be disposed on opposed surfaces of the printed circuit board. TW Pat. No. 313341 discloses a related connector to be connected with a printed circuit board, which merely allows one connector to be equipped therewith. Such an arrangement will not meet the user's need, requiring the printed circuit board to be selectively mounted with at least two different connectors adapted for mating with different components.

In addition, as connectors are intended to be miniaturized to cater for the miniature trend of electrical devices, these connectors will have their bodies much thinner along the widths of the bodies, the problem of which is that it is difficult for the connectors to be mounted onto the printed circuit board by a securing member extending through the body of the connector. That is because the thinner connector is incapable of providing the thick body sufficient to have the securing member inserted therein so as to allow the connector to be mounted onto the printed circuit board by the inserted securing member. U.S. Pat. No. 5,823,799 disclosed a related connector having a thick connector body with a board inserted therebetween. However, the current connectors do not have such thick bodies that permits the boards to be inserted thereinto.

SUMMARY OF THE INVENTION

A connector, for providing a connection between a circuit board and an electronic component, according to an embodiment of the present invention includes a connector body having a front mating interface adapted to mate with the electronic component, an upper surface, a bottom surface, and a back mounting surface, wherein the back mounting surface is locatable between the upper surface and the bottom surface. A pair of solder components is located at opposite side sections of the connector body, each solder component adapted to extend from adjacent one of the upper and bottom surfaces towards the other of the upper and bottom surfaces in a first direction, and then reversely in an opposite second direction towards the mounting surface. The configuration of the solder components will take full advantage of the width of the side section of the connector body along a vertical direction so as to enable the solder components to have a strong connection between the connector and the circuit board.

Other features and advantages of the present invention will become more apparent to those skilled in the art upon examination of the following drawings and detailed description of preferred embodiments, in which:

DETAILED DESCRIPTION OF PREFERRED EMBODIMENTS

Figure 1:
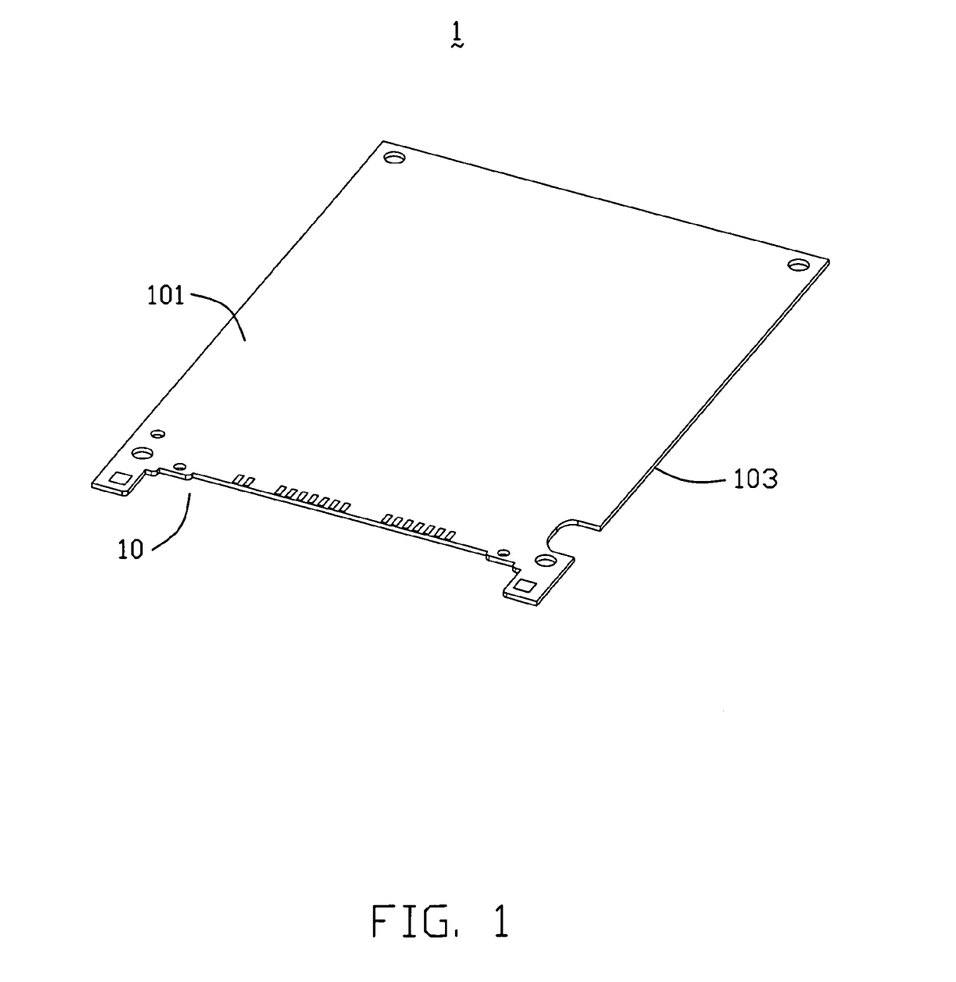
FIG. 1 is a perspective view showing a printed circuit board defining a cutout edge section with opposed upper and bottom surfaces according to an embodiment of the present invention.
Figure 2:
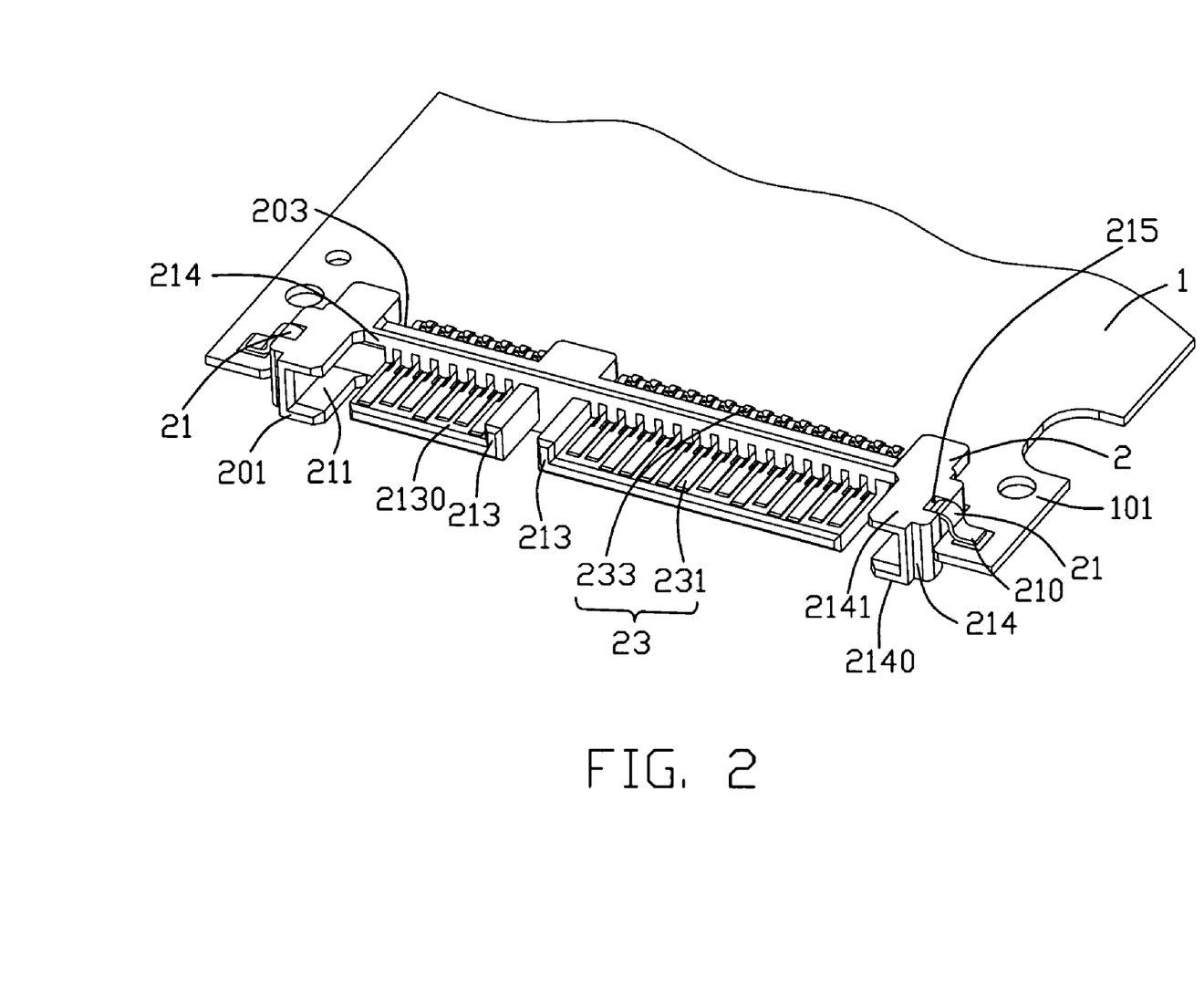
FIG. 2 is a perspective view showing a first connector electrically connected to the upper surface of the printed circuit board of FIG. 1.
Figure 3:
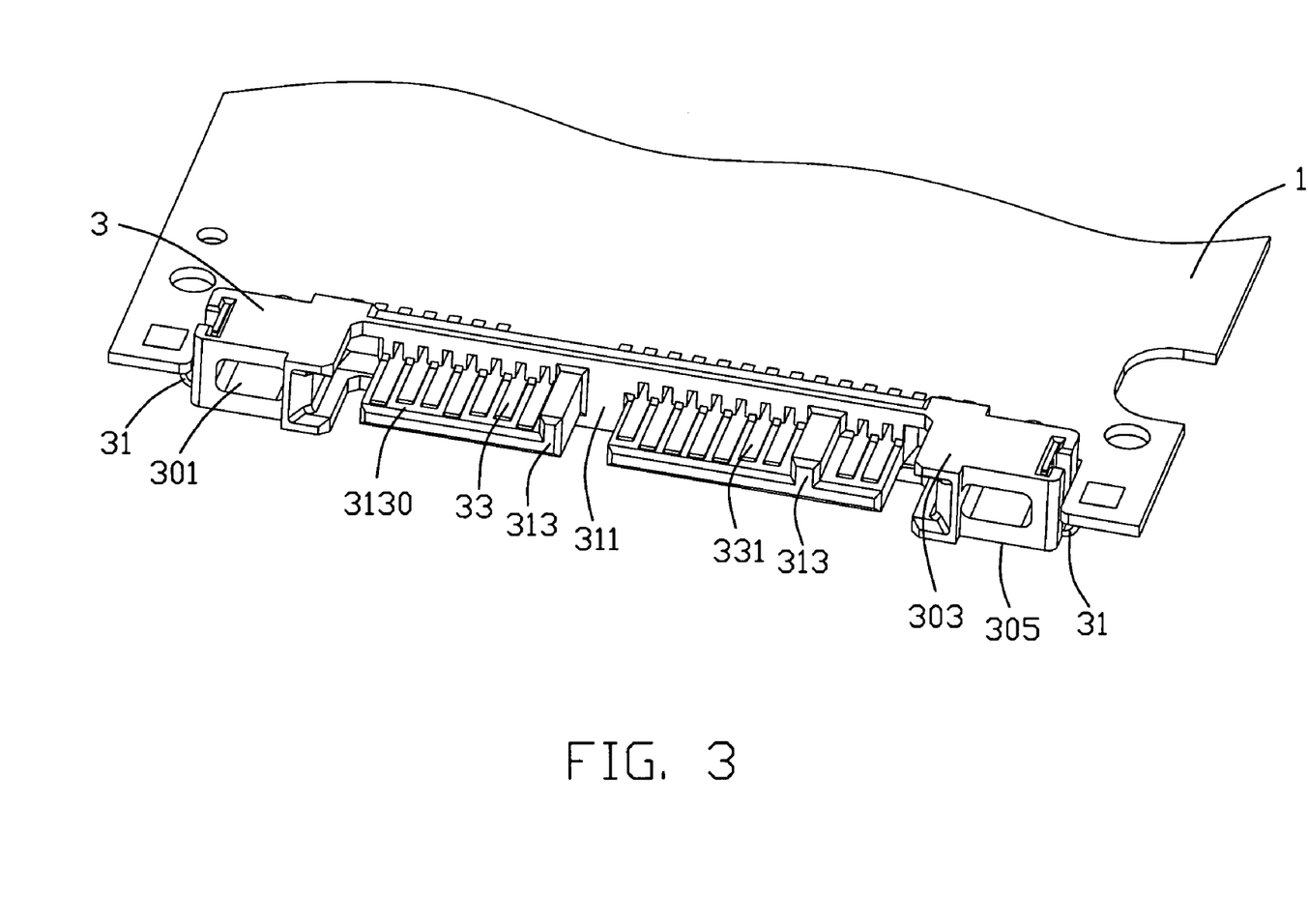
FIG. 3 is a perspective view showing a second connector electrically connected to the bottom surface of the printed circuit board of FIG. 1.
Figure 4:
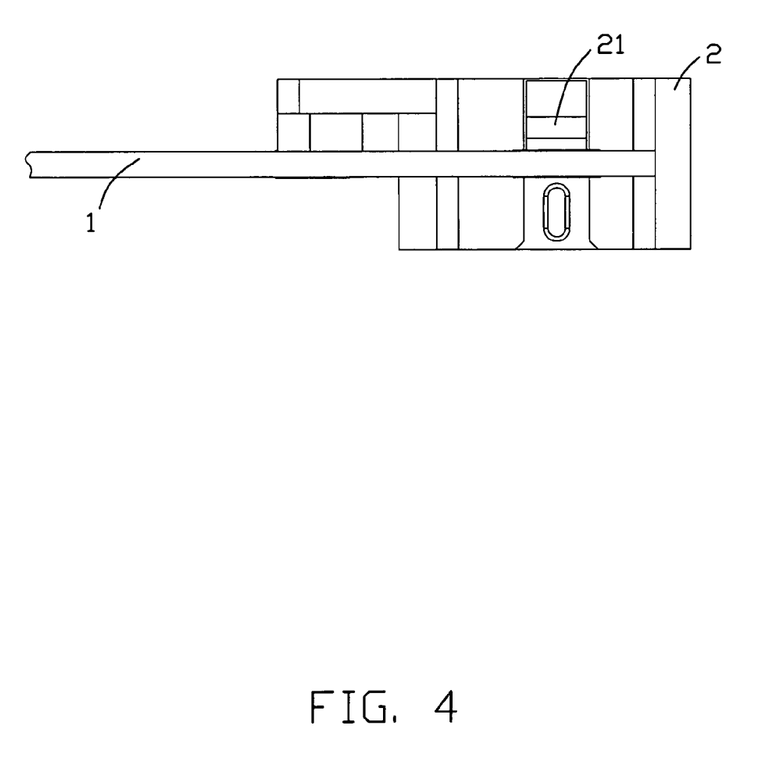
FIG. 4 is a side view of the electrical connector assembly of FIG. 2.
Figure 5:
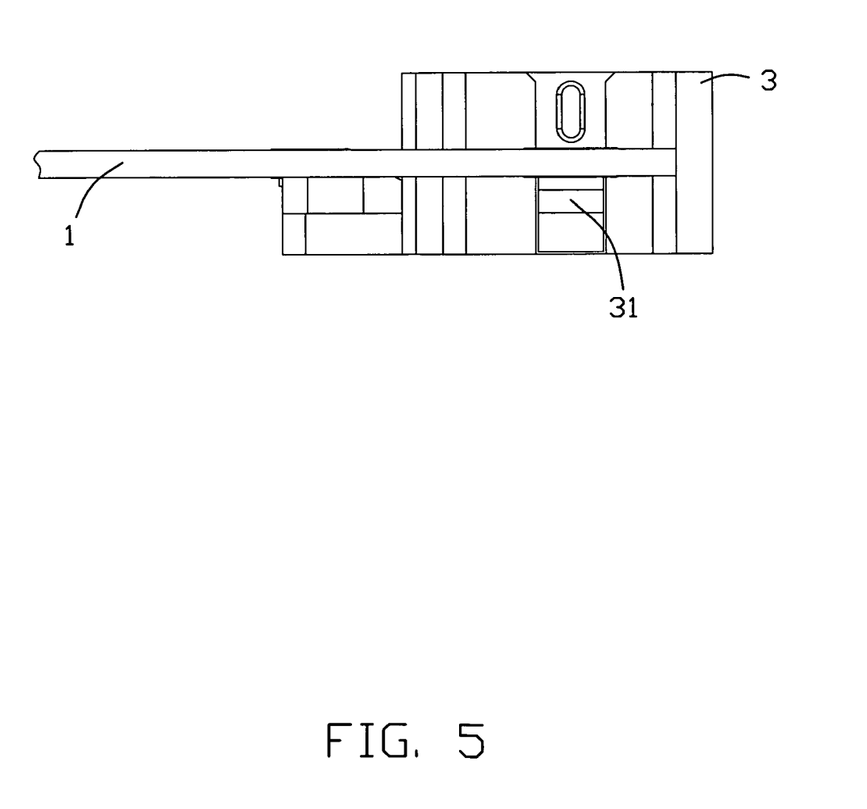
FIG. 5 is a side view of the electrical connector assembly of FIG. 3.

Referring to FIGS. 1 to 5, an interconnection system according to an embodiment of the present invention is shown to include a printed circuit board 1 defining a cutout edge section 10 having opposed upper and bottom surfaces 101 and 103, with an upper contact region along a lengthwise direction of the upper surface 101, and an bottom contact region along a lengthwise direction of the bottom surface 103. In a preferred embodiment, a first connector 2 is assembled to the upper surface 101 of the printed circuit board 1 by first solder connection elements 21 and electrically connected with the upper contact region, while a second connector 3, which may be structurally different from the first connector 2, is assembled to the bottom surface 103 of the printed circuit board 1 by second solder connection elements or components 31 and electrically connected with the bottom contact region. Note that, in this preferred embodiment, the printed circuit board 1 is capable of being equipped with the first and second connectors 2 and 3, while, in use, having only one of them mounted thereto. Thus, this arrangement will meet the user's requirement, having the printed circuit board 1 to be selectively mounted with two different connectors adapted for mating with different components. As shown in FIGS. 4-5, the printed circuit board 1, from a side view thereof, is located at a middle section of the first or second connector 2 or 3, but having no portion of the printed circuit board 1 inserted into the body of the first or second connector.

Figure 6:
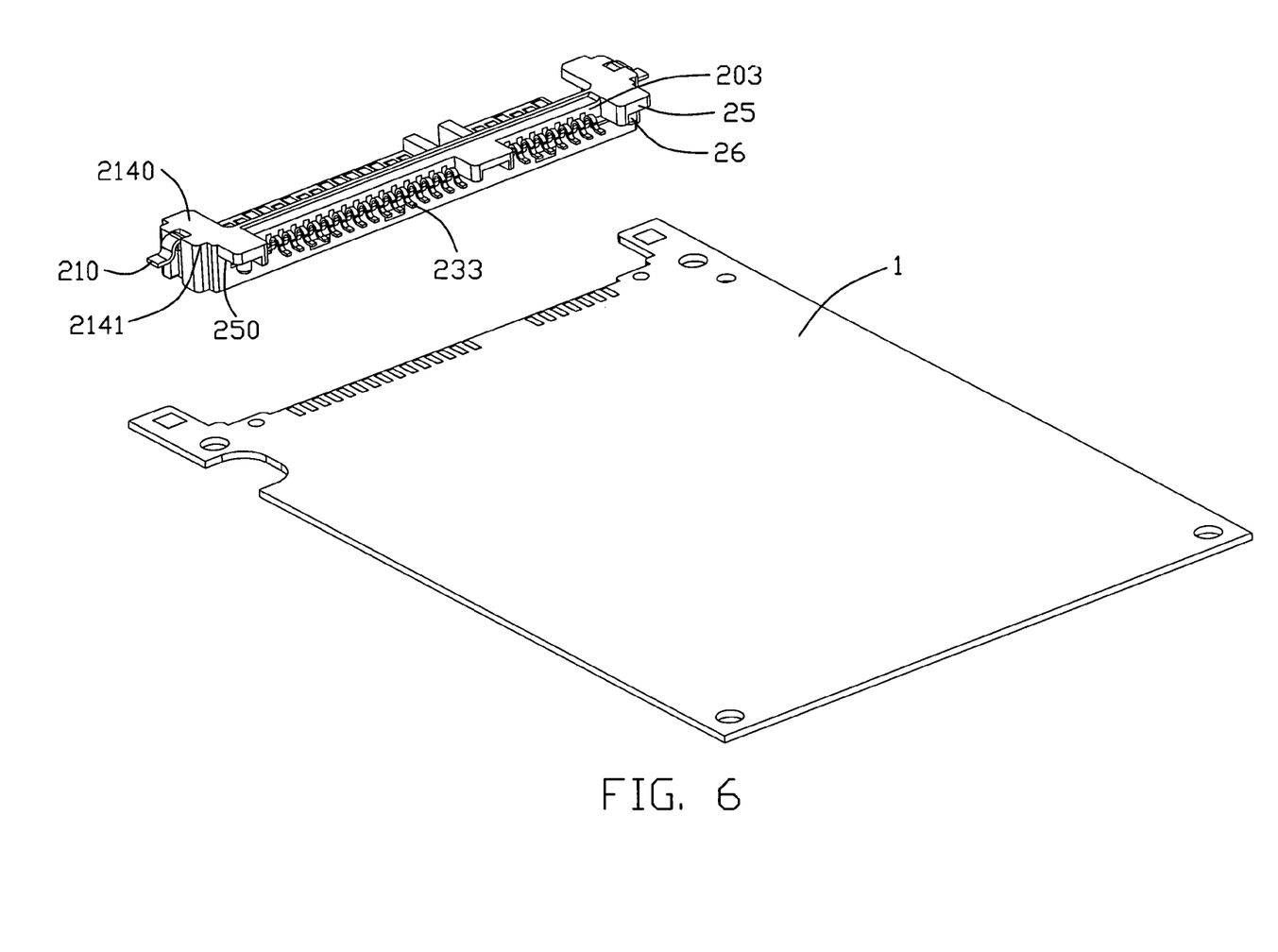
FIG. 6 is an exploded, perspective view of the first connector and the printed circuit board of FIG. 2.
Figure 8:
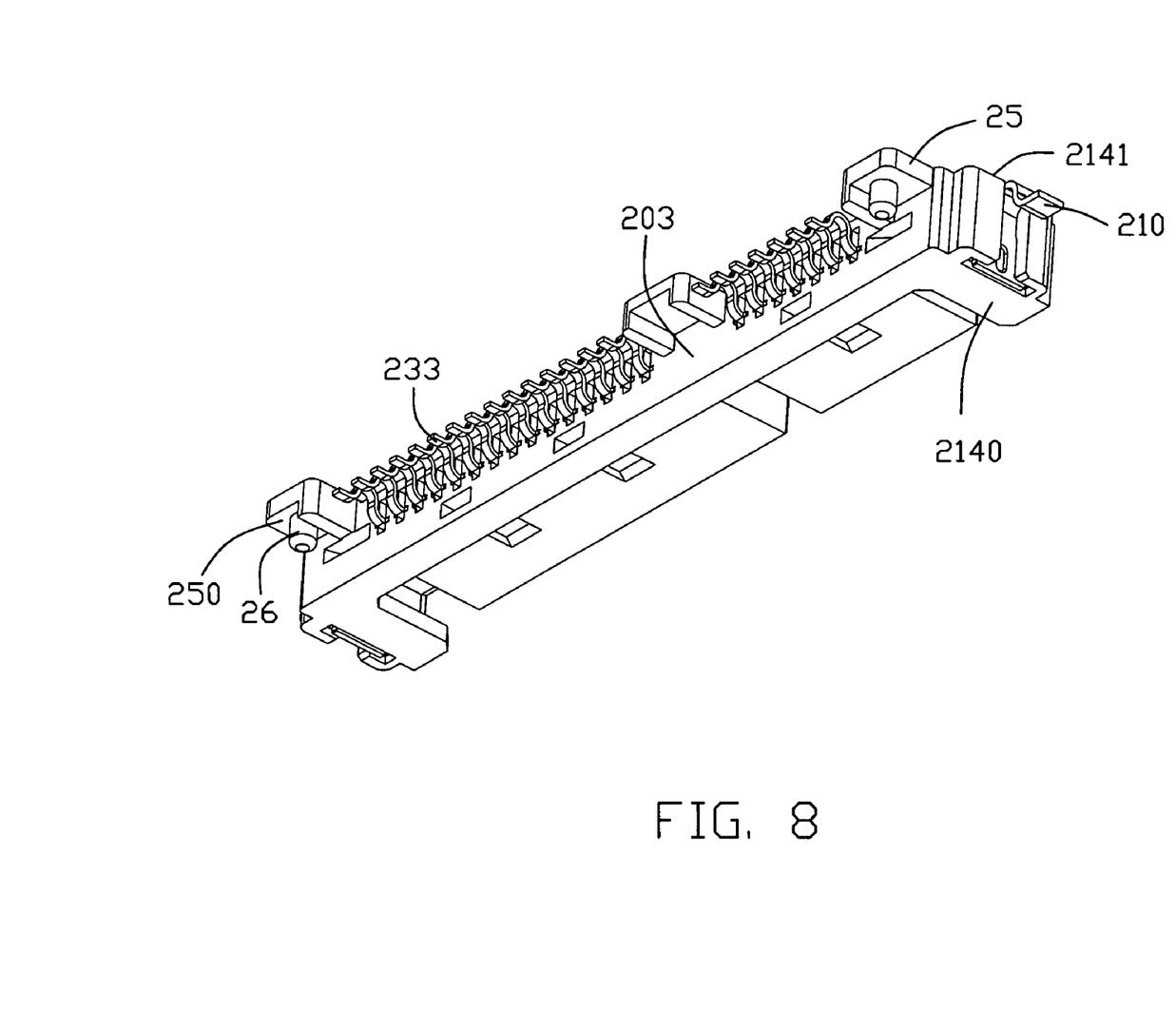
FIG. 8 is another perspective view of the first connector of FIG. 2.

Referring to FIGS. 2, 6 and 8, the first connector 2 includes a base having a mating interface 201 adapted to mate with an electronic component, such as a mating connector, and a back face or wall 203 opposite to the mating interface 201. The base, made of insulative material, has a mating port 211 on the mating interface 201, with two mating tongues 213, generally of an L shape, extending from a front wall 214 into the mating port 211, and a pair of side connection sections 214 integrally attached thereto and each defining thereof an upper surface 2140 and a bottom surface 2141, with the first solder connection elements 21 disposed therein. A plurality of first terminals 23, including power and signal terminals, has their front contact sections 231 extending towards the mating interface 201, actually on an upper surface 2130 of each mating tongue 213, and their opposite back contact sections 233 locatable between back mounting platforms 25 and extending exposed out of the back wall 203 to be set in a common horizontal mounting plane. The horizontal mounting plane is locatable between the upper surface 2140 and the bottom surface 2141 of each side connection section 214. Each solder connection element 21 is configured to extend from adjacent the bottom surface 2140 towards the upper surface 2141 in a first or upward direction, and then reversely in an opposite second or downward direction to be terminated at a horizontal solder section 210, wherein the horizontal solder sections 210 are disposed at a same level with the common horizontal mounting plane defined by the first terminals 23 in order to have the first connector 2 surface mounted onto the upper surface 101 of the printed circuit board 1. In this embodiment, each side connection section 214 includes a through slot 215, extending from the upper surface 2141 to the bottom surface 2140, for receipt of the solder connection element 21. The configuration of the solder connection element 21 will take full advantage of the width of the side connection section 214 along a vertical direction so as to enable the solder connection elements 21 to have a strong connection between the first connector 2 and the printed circuit board 1. In addition, the base also includes a pair of back mounting platforms 25, shown in FIG. 6, extending backward from the back wall 203 of the base, each with a back post 26 attached thereto. Each back mounting platform 25 has thereof a board mounting surface 250 being at a same level with the horizontal solder section 210, with the back post 26 extending from the board mounting surface 250 in the second or upward direction, so as to assist in mounting the first connector 2 onto the printed circuit board 1.

Figure 7:
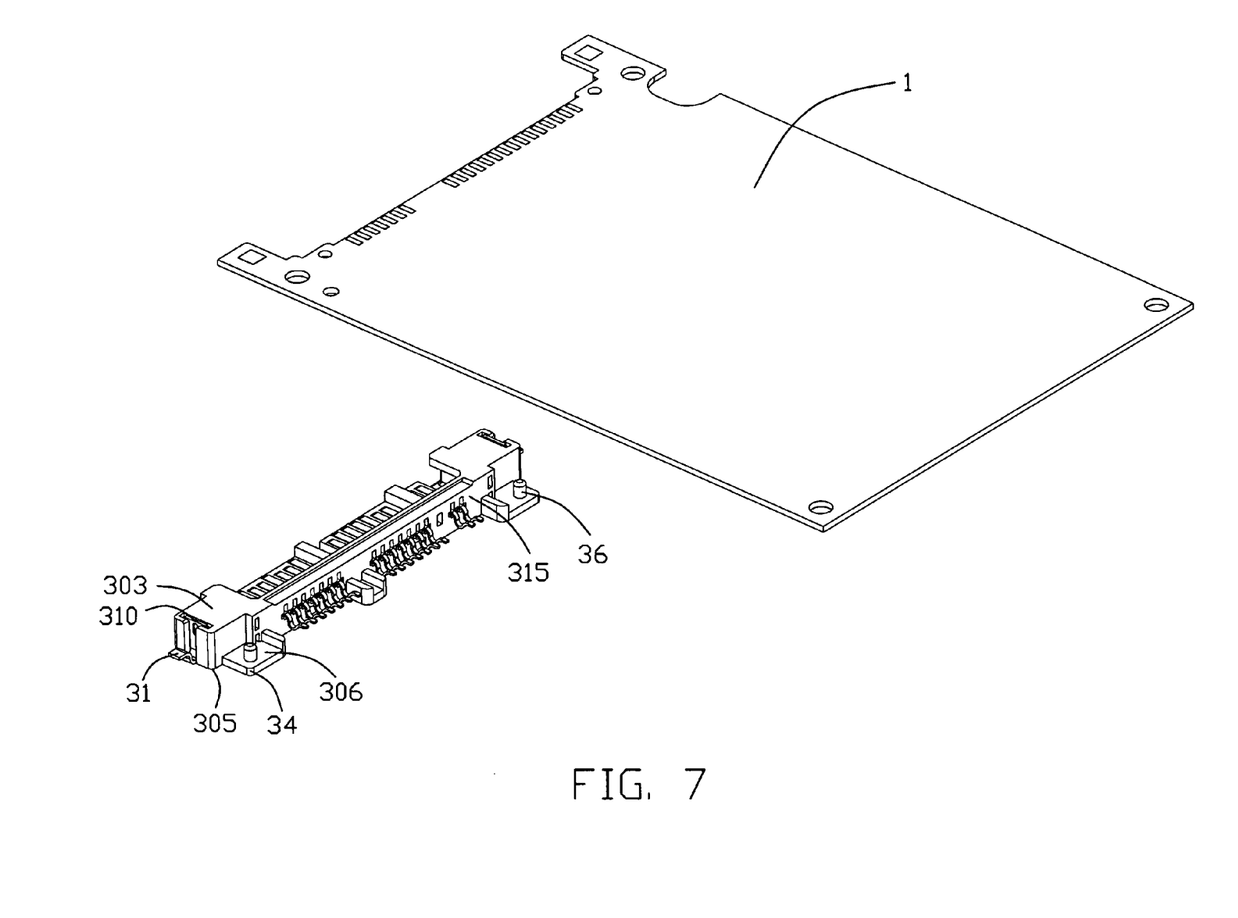
FIG. 7 is an exploded, perspective view of the second connector and the printed circuit board of FIG. 3.
Figure 9:
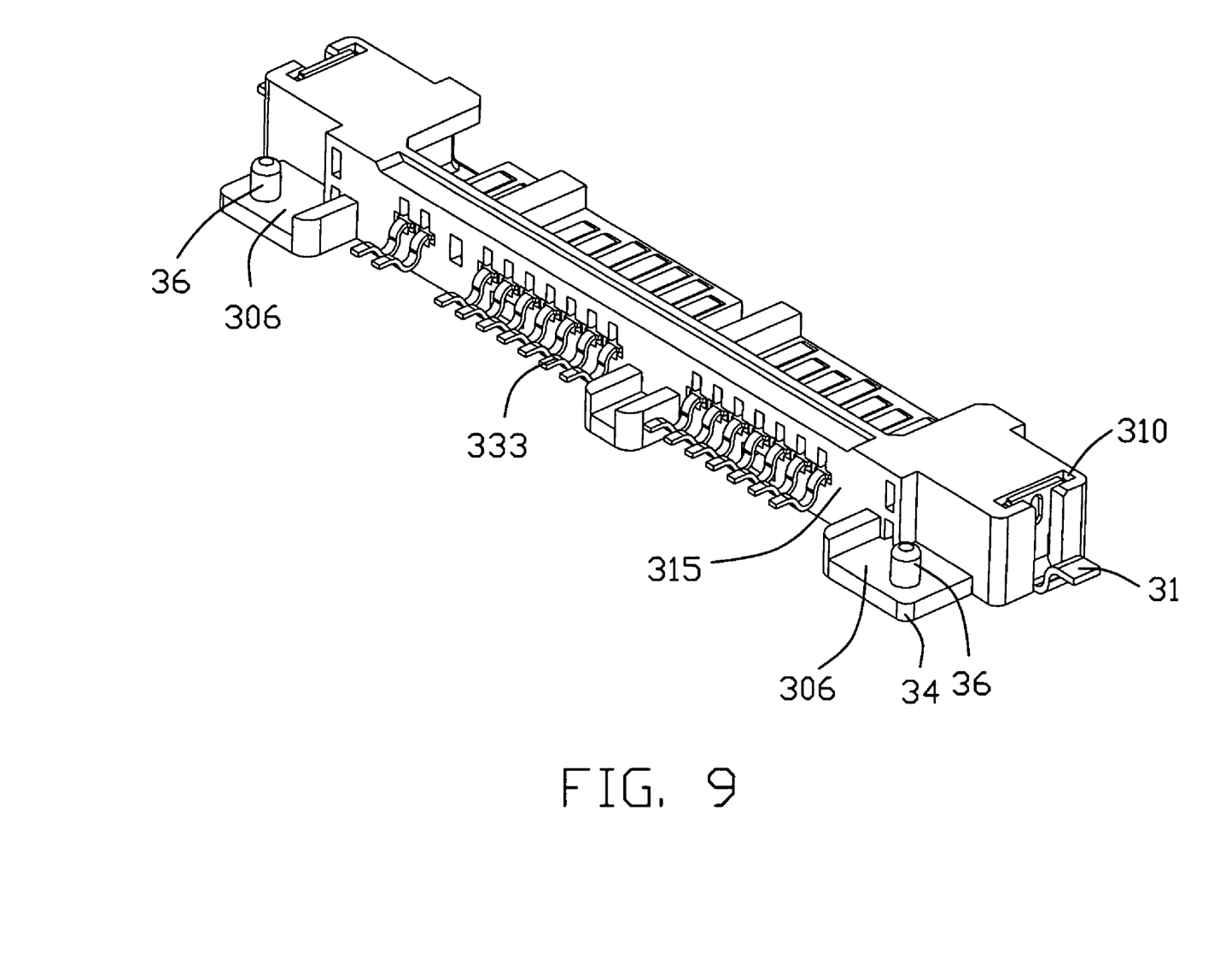
FIG. 9 is another perspective view of the second connector of FIG. 3.

Referring to FIGS. 3, 7 and 9, the second connector 3 includes a connector body having a front mating interface 301 adapted to mate with an electrical device, such as a mating connector, an upper surface 303, a bottom surface 305, and a back mounting surface 306 shown in FIG. 7, wherein the back mounting surface 306, laterally spaced away from the front mating interface 301 by the solder components 31 and normal to the front mating interface 301, is arranged locatable between the upper surface 303 and the bottom surface 305 of the connector body. The connector body has two spaced mating tongues 313 extending forward from a front wall 311 of the body to the front mating interface 301. A plurality of second terminals 33, including signal and power terminals, has front contact segments 331 disposed on upper surfaces 3130 of the mating tongues 313, and back contact segments 333 extending out of a back wall or face 315 of the connector body to be set in a common horizontal plane, being at a same level with the back mounting surface 306, so as to have the second connector 3 surface mounted onto and electrically connected to the printed circuit board 1. A pair of solder components 31 is located at opposite side sections of the connector body, with each adapted to extend from adjacent the upper surface 303 towards the bottom surface 305 in a first direction, i.e., a downward direction, and then reversely in an opposite second direction, i.e., an upward direction, towards the back mounting surface 306 in order to have the second connector 3 assembled to the printed circuit board by the solder components 31. In this embodiment, the connector body includes a through hole 310 extending from the upper surface 303 to the bottom surface 305 on each of the side sections of the body, for receipt of the solder component 31. The configuration of the solder component 31 will take full advantage of the width of the side section of the connector body along the vertical direction so as to enable the solder components 31 to have a strong connection between the second connector 3 and the printed circuit board 1. The connector body also includes a pair of back boards 34, extending backward from the back wall 315 opposite to the front wall 311 of the connector body. The back boards 34 define the back mounting surface 306 with a pair of back tabs 36 extending therefrom in the second upward direction to be inserted into corresponding holes of the printed circuit board 1 so as to assist in mounting the second connector 3 onto the printed circuit board 1. It should be noted that the first and second connector are the same, merely having disposed in a reverse relationship with respect to the printed circuit board 1 except for the front mating interface 201 or 301 of the connector.

Figure 10:
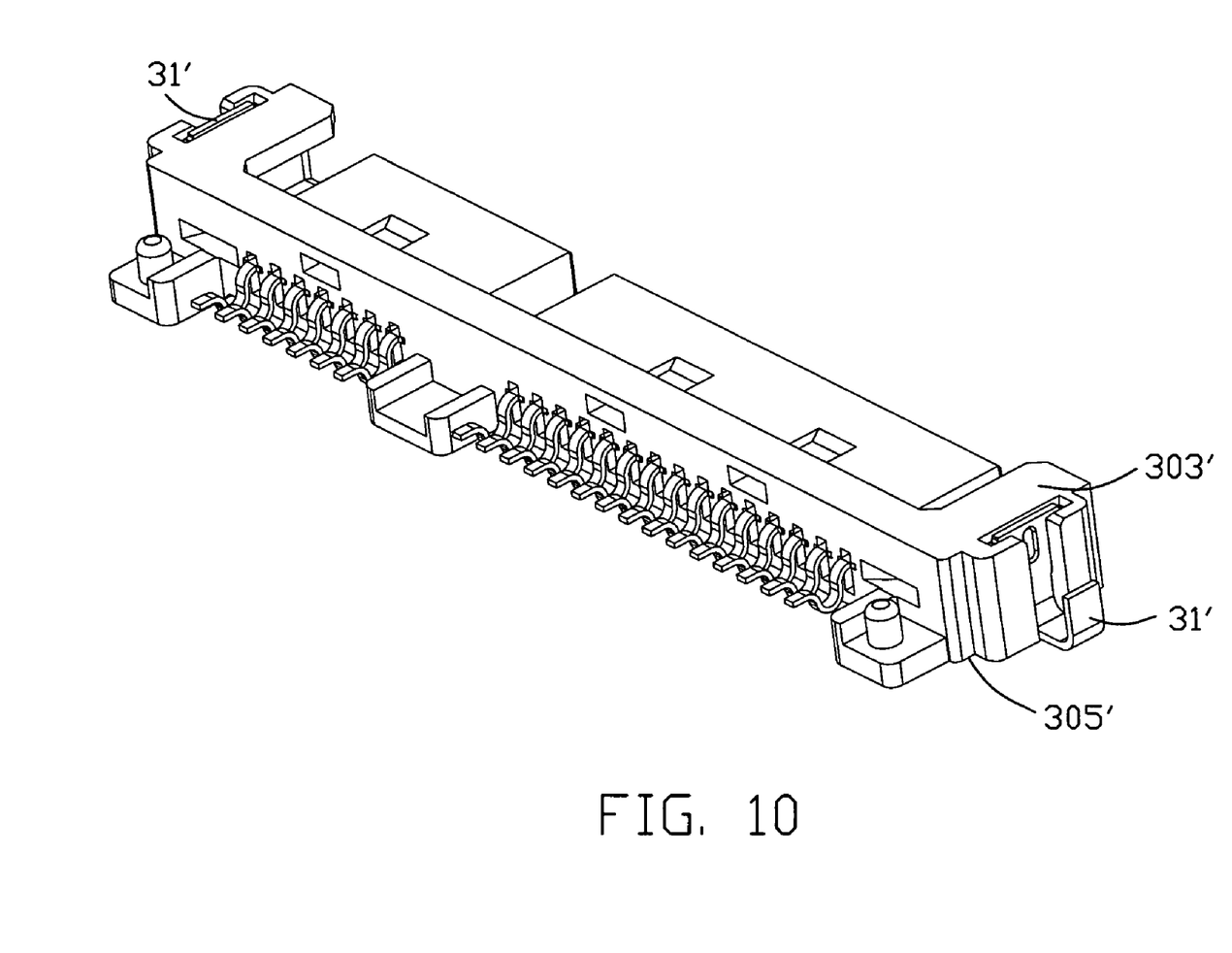
FIG. 10 is a perspective view of a first connector according to a second embodiment of the present invention.

Referring to FIG. 10, a second connector 3' of the second embodiment of the present invention is shown to have each solder component 31' extending from adjacent an upper surface 303' of the connector body downwards to a bottom surface 305', and then reversely upwards to be inserted into a hole of the printed circuit board so as to have the second connector 3' mounted to the printed circuit board.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A connector for providing a connection between a circuit board and an electronic component, the connector comprising:
   a base having a mating interface adapted to mate with the electronic component, and a back wall opposite to the mating interface, the base including a pair of side connection sections with each defining thereof an upper surface and a bottom surface, and a pair of back mounting platforms;
   a plurality of contact terminals having first contact sections extending towards the mating interface, and opposite second contact sections locatable between the pair of back mounting platforms and extending out of the back wall to be set in a common horizontal mounting plane, said horizontal mounting plane locatable between the upper surface and bottom surface; and
   solder connection elements disposed in the respective side connection sections, each said solder connection element having an initial end extending from adjacent one of said upper and bottom surfaces toward the other of said upper and bottom surface in a first direction to an inverse point, and then reversely in an opposite second direction to be terminated at a horizontal solder section being at a same level with the common horizontal mounting plane, the distance defined between said initial end and the inverse point being than the distance defined between said horizontal solder section and the inverse point.

2. The connector of claim 1, wherein each said back mounting platform has a back post extending therefrom in said second direction, said back mounting platform defining a board mounting surface being at a same level with said horizontal solder section.

3. The connector of claim 1, wherein the base has a front wall opposite to the back wall, and a mating tongue extending forward from the front wall, the first contact sections disposed on a surface of said mating tongue.

4. The connector of claim 1, wherein each said side connection section includes a through slot extending from the upper surface to the bottom surface for receipt of the solder connection element.

5. A connector for providing a connection between a circuit board and an electronic component, the connector comprising:
   a connector body having a front mating interface adapted to mate with the electronic component, an upper surface, a bottom surface, and a pair of back platforms opposite to the front mating interface, said back platforms defining a mounting surface locatable between the upper surface and the bottom surface;
   a plurality of terminals having front contact sections extending towards the mating interface, and opposite back contact sections extending exposed out of a back wall of the connector body, wherein said exposed back contact sections is located between the pair of back platforms; and
   a pair of solder components locatable at opposite side sections of the connector body, each said solder component having an initial end adapted to extend from adjacent one of the upper and bottom surfaces towards the other of the upper and bottom surfaces in a first direction to an inverse point, and then reversely in an opposite second direction towards said mounting surface to a terminating end, said initial end located more away form the inverse point than said terminating end.

6. The connector of claim 5, wherein each said back platform includes a back mounting tab extending from the mounting surface in the second direction.

7. The connector of claim 5, wherein the connector body has opposite front and back walls, and a plurality of terminals extending between the front wall and the back wall.

8. The connector of claim 7, wherein the connector body includes a mating tongue extending forward from the front wall, the terminals including front contact sections disposed on a surface of said mating tongue.

9. The connector of claim 5, wherein the connector body includes a through slot on each of side sections thereof, the through slot extending from the upper surface to the bottom surface.

10. An electrical connector assembly comprising:
   a printed circuit board defining a cutout edge section with opposed upper and bottom surfaces and a pair of mounting holes;
   a first connector including a base having a front mating face adapted to mate with a first mating component, and a back wall opposite to the front mating face;
   a plurality of first terminals having front contact sections extending towards the front mating face, and back contact sections extending exposed out of the back wall of the base and adapted to be mounted onto the upper surface of the board;
   a pair of first mounting posts extending downward from the base;
   a second connector including a body having a front mating surface adapted to mate with a second mating component, and a back face opposite to the front mating surface;
   a plurality of second terminals having front contact portions extending towards the front mating surface, and back contact portions extending exposed out of the back face of the body and adapted to be mounted onto the bottom surface of the printed circuit board; and
   a pair of second mounting posts upwardly extending from the body; wherein
   the printed circuit board is capable of being mutually exclusively equipped with the first and second connectors under a condition that said first mounting posts and said second mounting posts share the same pair of mounting holes.

11. The electrical connector assembly as claimed in claim 10, wherein the first connector and the second connector are located at a same level with regard to the printed circuit board, when assemble.

12. The electrical connector assembly as claimed in claim 10, wherein the front mating face of the first connector and the front mating surface of the second connector are arranged to face in a same vertical direction.

13. The electrical connector assembly as claimed in claim 12, wherein the front mating face and the front mating surface are located at a same level with regard to the printed circuit board, when assembled.

14. The electrical connector assembly as claimed in claim 10, wherein the first connector further includes a pair of first solder sections locatable within the base, and the second connector further includes a pair of second solder sections locatable within the body.

15. The electrical connector assembly as claimed in claim 14, wherein each first solder section extends from adjacent the bottom surface of the base in an upward direction, and then reversely in a downward direction to be connected to the printed circuit board on the upper surface, and each second solder section extends from adjacent the upper surface of the body in the downward direction, and then reversely in the upward direction to be connected to the printed circuit board on the bottom surface.

* * * * *